United States Patent
Lee

(10) Patent No.: US 8,947,932 B2
(45) Date of Patent: Feb. 3, 2015

(54) HIGH-PERFORMANCE ONE-TRANSISTOR FLOATING-BODY DRAM CELL DEVICE

(75) Inventor: Jong-Ho Lee, Seoul (KR)

(73) Assignee: SNU R&DB Foundation (KR)

( * ) Notice: Subject to any disclaimer, the term of this patent is extended or adjusted under 35 U.S.C. 154(b) by 694 days.

(21) Appl. No.: 12/708,342

(22) Filed: Feb. 18, 2010

(65) Prior Publication Data
US 2010/0207180 A1    Aug. 19, 2010

(30) Foreign Application Priority Data

Feb. 19, 2009   (KR) .................. 10-2009-0013849

(51) Int. Cl.
*H01L 27/108*   (2006.01)
*H01L 29/78*   (2006.01)

(52) U.S. Cl.
CPC .......... *H01L 29/7841* (2013.01); *H01L 27/108* (2013.01); *H01L 27/10802* (2013.01)
USPC ............ 365/185.08; 365/185.01; 365/185.18; 257/298; 257/E27.084

(58) Field of Classification Search
CPC ...................... H01L 27/10802; H01L 29/7841
USPC ........ 257/298, E27.085; 365/185.01, 185.08, 365/185.18
See application file for complete search history.

(56) References Cited

U.S. PATENT DOCUMENTS

| | | | | |
|---|---|---|---|---|
| 5,021,851 | A * | 6/1991 | Haken et al. | 257/332 |
| 5,929,479 | A * | 7/1999 | Oyama | 257/315 |
| 6,538,916 | B2 * | 3/2003 | Ohsawa | 365/149 |
| 7,239,549 | B2 * | 7/2007 | Fazan et al. | 365/185.14 |
| 7,855,917 | B2 * | 12/2010 | Fukuda | 365/185.14 |
| 7,875,532 | B2 * | 1/2011 | Kakehata et al. | 438/458 |
| 2003/0168677 | A1 | 9/2003 | Hsu | |
| 2005/0029592 | A1 * | 2/2005 | Campbell et al. | 257/347 |

(Continued)

FOREIGN PATENT DOCUMENTS

| | | |
|---|---|---|
| JP | 2002-343886 | 11/2002 |
| KR | 10-0466559 | 1/2005 |

(Continued)

OTHER PUBLICATIONS

Charles Kuo et al., A Capacitorless Double Gate DRAM Technology for Sub-100-nm Embedded and Stand-Alone Memory Applications, IEEE Transactions on Electron Devices, Dec. 2003, vol. 50, No. 12, pp. 2408-2416.

(Continued)

*Primary Examiner* — Michael Jung
*Assistant Examiner* — John P Dulka
(74) *Attorney, Agent, or Firm* — Cantor Colburn LLP

(57) ABSTRACT

Provided is a one-transistor (1T) floating-body DRAM cell device including a substrate; a gate stack which is formed on the substrate; a control electrode which is disposed on the substrate and of which some or entire portion is surrounded by the gate stack; a semiconductor layer which is formed on the gate stack; a source and a drain which are formed in the surface of the semiconductor layer and of which lower surfaces are not in contact with the gate stack; a gate insulating layer which is formed on the semiconductor layer; and a gate electrode which is formed on the gate insulating layer, wherein the remaining portion of the semiconductor layer excluding the source and the drain is configured as a floating body. The miniaturization characteristic and performance of a MOS-based DRAM cell device can be improved, and a memory capacity can be increased.

16 Claims, 15 Drawing Sheets

(56) References Cited

U.S. PATENT DOCUMENTS

| | | | |
|---|---|---|---|
| 2005/0093021 A1* | 5/2005 | Ouyang et al. | 257/194 |
| 2006/0125010 A1* | 6/2006 | Bhattacharyya | 257/347 |
| 2006/0186484 A1* | 8/2006 | Chau et al. | 257/401 |
| 2006/0284236 A1* | 12/2006 | Bhattacharyya | 257/314 |
| 2008/0061346 A1* | 3/2008 | Tang et al. | 257/314 |
| 2008/0239789 A1* | 10/2008 | Shino et al. | 365/149 |
| 2009/0147580 A1* | 6/2009 | Lee | 365/185.08 |
| 2010/0102372 A1* | 4/2010 | Lee et al. | 257/298 |

FOREIGN PATENT DOCUMENTS

| KR | 10-2006-0070705 | 6/2006 |
|---|---|---|
| KR | 10-2009-0021744 | 3/2009 |

OTHER PUBLICATIONS

Arvind Kumar et al., Scaling of Flash NVRAM to 10's of nm by Decoupling of Storage from Read/Sense Using Back-Floating Gates, IEEE Transactions on Nanotechnology, Dec. 2002, vol. 1, No. 4, pp. 247-254.

Chang Woo Oh et al., Floating Body DRAM Characteristics of Silicon-On-ONO (SOONO) Devices for System-on-Chip (SoC) Applications, 2007 Symposium on VLSI Technology Digest of Technical Papers, pp. 168-169.

* cited by examiner

FIG. 1A *Prior Art*
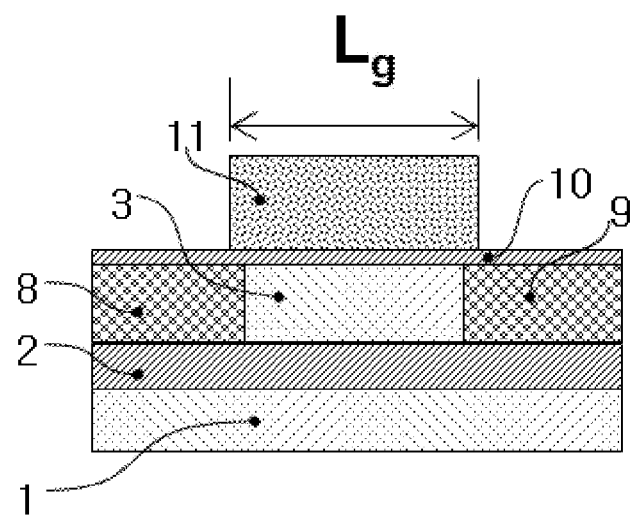
FIG. 1B *Prior Art*
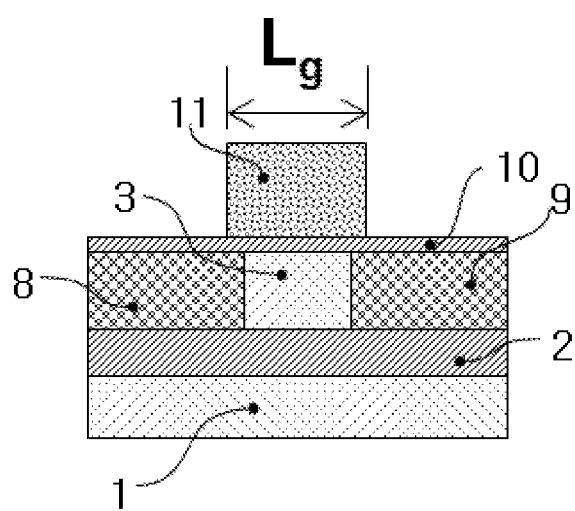

FIG. 2A *Prior Art*
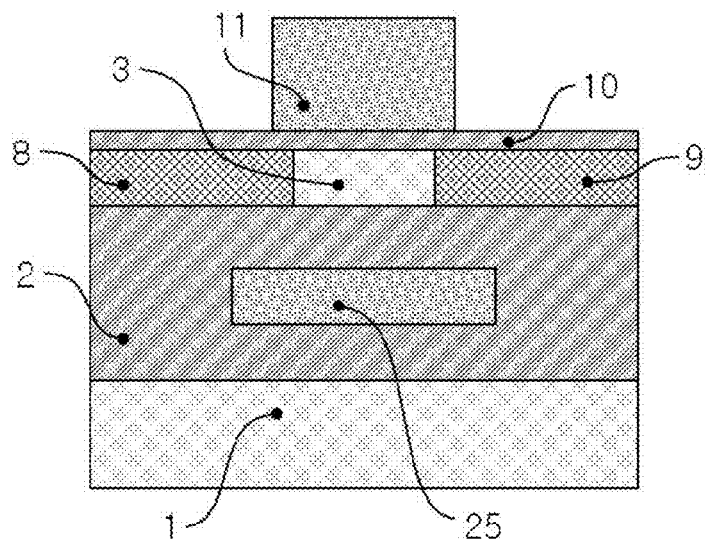
FIG. 2B *Prior Art*
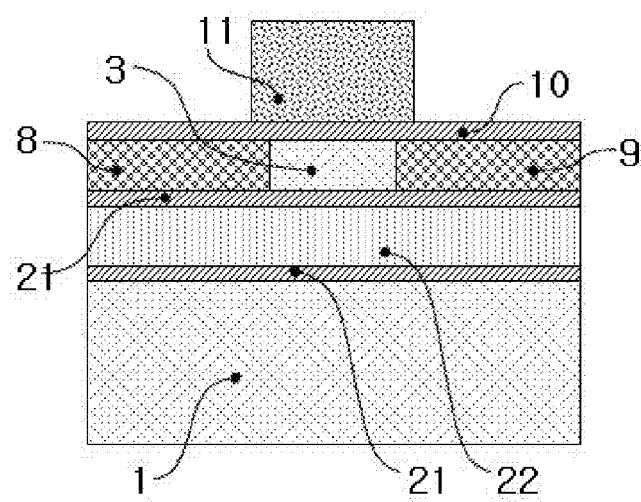

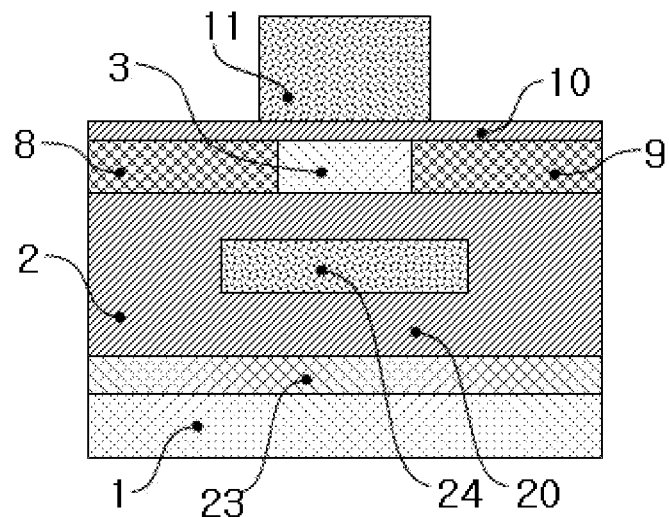
FIG. 2C *Prior Art*
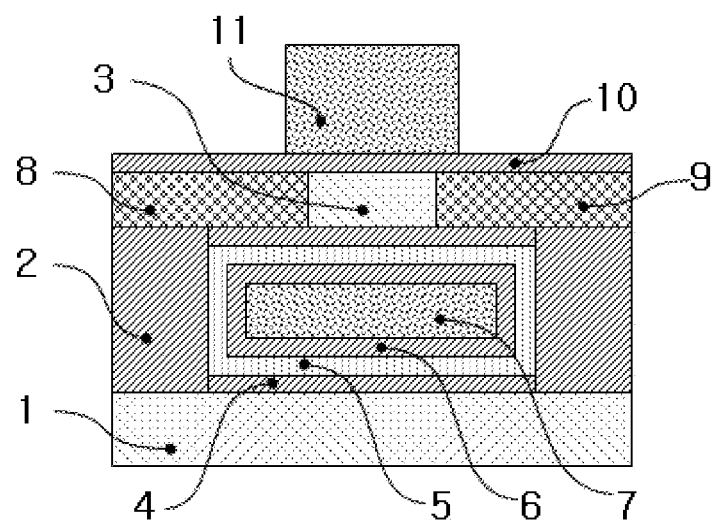
FIG. 2D *Prior Art*

HIGH-PERFORMANCE ONE-TRANSISTOR FLOATING-BODY DRAM CELL DEVICE

CROSS-REFERENCE TO RELATED PATENT APPLICATION

This application claims the benefit of Korean Patent Application No. 10-2009-0013849, filed on Feb. 19, 2009, in the Korean Intellectual Property Office, the disclosure of which is incorporated herein in its entirety by reference.

BACKGROUND OF THE INVENTION

1. Field of the Invention

The present invention relates to a one-transistor (1T) floating-body DRAM cell device, and more particularly, to a 1T floating-body DRAM cell device of which performance can be improved by providing a double-gate structure having a non-volatile function to one electrode and by forming source and drain regions so as not to be in contact with an underlying gate stack.

2. Description of the Related Art

An existing dynamic random access memory (DRAM) cell is constructed with one metal oxide semiconductor (MOS) transistor and one cell capacitor. Recently, as a degree of integration in a DRAM is increasingly required, a size of a cell device needs to be reduced, and a size of a cell capacitor needs to be reduced. Such a miniaturization of the cell device and the cell capacitor in the MOS device requires very difficult manufacturing processes. Recently, MOS devices having a floating body have been used as DRAM cell devices. In the devices, DRAM memory operations may be performed by storing or removing charges in the floating body. In this technology, since one MOS cell device is used, the DRAM can be implemented by using simple processes unlike the conventional DRAM Such a DRAM cell device is referred to as a 1T floating body DRAM cell device (hereinafter, simply referred to as a "1T DRAM cell device" or a "1T-DRAM cell device"). In addition, the 1T DRAM cell device can be embedded in an existing logic circuit (for example, a microprocessor or a network-processor). In this case, the 1T DRAM cell device is called an eDRAM cell device. The 1T DRAM cell device used in the eDRAM has a high memory capacity or a high operating speed, so that its applications are increased. The 1T DRAM cell device has a floating body. The adjacent floating bodies are electrically isolated from each other so as to be floated. The 1T DRAM cell device includes a floating body. The floating body of the 1T DRAM cell device is electrically isolated from adjacent bodies so as to be floated. Therefore, information can be stored in the floating body. As a result, unlike an existing DRAM cell device, the 1T DRAM cell device does not require a cell capacitor, so that a cell area can be reduced. Accordingly, a degree of integration of the DRAM cell device can be improved.

FIGS. 1A and 1B are cross-sectional views illustrating 1T DRAM cell devices having a double-gate structure in the related art. The 1T DRAM cell device shown FIG. 1A is disclosed in U.S. Pat. No. 7,239,549. Referring to FIG. 1A, a first insulating layer 2 is formed on a semiconductor substrate 1, and a single-crystalline silicon layer is formed on the first insulating layer 2. The single-crystalline silicon layer includes a floating body 3 and a source 8 and a drain 9 that are formed at the left and right sides of the floating body 3. A gate insulating layer 10 is formed the single-crystalline silicon layer including the floating body 3, the source 8, and the drain 9, and a gate electrode 11 is disposed on the gate insulating layer 10.

Now, operations of the 1T DRAM cell device shown in FIG. 1A are described in brief. In the description hereinafter, the 1T DRAM cell device is assumed to be an NMOS cell device. The same description can be made in the case of a PMOS cell device. First, a "write 1" operation is described. In the "write 1" operation, the source 8 is grounded, and voltages are applied to the drain 9, that is, a bit line, and to the gate electrode 11, that is, a word line, so that impact ionization can easily occur. As a result, holes are generated in the floating body 3 in the vicinity of the drain 9. Some portions of the holes are accumulated, and others pass through a potential barrier to be flown to the source 8. A threshold voltage of the device is changed by a concentration of the hole accumulated in the floating body 3, so that a drain current is changed in a read operation. According to the "write 1" operation, excessive holes may exist in the floating body 3, and the threshold voltage of the device may be decreased, so that the drain current may be increased. Now, a read operation is described. In the read operation, a voltage that is the threshold voltage or more is applied to the gate electrode 11, and a bit line read voltage that is lower than that of the "write 1" operation is applied to the drain 9. There is a difference in the drain current according to whether the holes in the floating body 3 are in an excessive state or in a depleted state due to erasing. By reading the difference in the drain current, the information stored in the DRAM cell device can be recognized.

Finally, a "write 0" operation is described. In the "write 0" operation, an appropriate voltage is applied to the gate electrode 11, and a negative voltage is applied to the drain 9. As a result, the holes in the floating body 3 are leaked into the drain 9, so that the floating body 3 is in the hole depleted state. Accordingly, the threshold voltage of the device is increased.

Now, as another example of the "write 1" operation, a method using GIDL (gate induced drain leakage) is described. In this operation, a voltage of 0V or a negative voltage is applied to the gate electrode 11 of the device, and a positive voltage is applied to the drain 9 connected to the bit line. As a result, electron-hole pairs are generated in the area, where the drain 9 and the gate electrode 11 are overlapped, due to band-to-band tunneling. The electrons flow to the drain 9, and the holes are stored in the floating body 3.

In addition, as still another example of the "write 1" operation, a method using a bipolar effect (floating base bipolar action) is described. In this operation, a voltage of 0V or a low negative voltage is applied to the gate electrode 11 of the device, and a high positive voltage is applied to the drain 9 connected to the bit line. As a result, electron-hole pairs are generated due to avalanche breakdown between the drain 9 and the floating body 3. The electrons flow to the drain 9, and the holes are stored in the floating body 3.

The proceeding from the structure shown in FIG. 1A to the structure shown in FIG. 1B denotes a miniaturization of the length Lg of gate electrode. The miniaturization of the DRAM cell device is very important because it leads to an increase in capacity of the DRAM cell device. However, due to the miniaturization of channel length, a short channel effect occurs. In addition, a size of the floating body which stores information is reduced, so that a difference in drain current between the "write 1" state and the "write 0" state is decreased. Accordingly, it is difficult to sense and to store information for a long time.

In order to solve the problem, several 1T DRAM cell devices having a double-gate structure have been proposed. The double-gate structure is known to be effective in the miniaturization of device. Hereinafter, the representative structure among the proposed double-gate structures will be described in detail. Now, four representative structures among the proposed double-gate structures are described. FIGS. 2A to 2D are cross-sectional views illustrating existing 1T-DRAM cell devices having a double-gate structure. In these 1T-DRAM cell devices, basically, an upper gate electrode 11 and a substrate 1 are used, or an additional electrode 5 is inserted as a lower electrode. In addition, in these 1T-DRAM cell devices, by using a bias of the lower electrode, the holes can be retained in the floating body 3 for a long time, and the sensing margin can be increased. The structures of the 1T-DRAM cell devices are described hereinafter.

FIG. 2A illustrates a structure of a 1T-DRAM cell device disclosed in an article, "A Capacitor-less Double Gate DRAM Technology for Sub-100-nm Embedded and Stand-Alone Memory Applications," (IEEE Trans. on Electron devices, vol. 50, no. 12, pp. 2408-2416, 2003) by Charles Kuo et al. in UC Berkeley. In the example, an upper gate 11 and a lower gate 25 are disposed on and under a floating body 3, respectively. The upper gate 11 and the lower gate 25 are electrically independent of each other. In the 1T DRAM cell device, due to the characteristics of the double-gate structure, it is possible to suppress the short channel effect and to improve the sensing margin. In the 1T DRAM cell device, a negative voltage (for example, −1V) is applied to the lower gate 25, so that the holes can be retained in the floating body 3 in the "write 1" operation for a long time. In addition, during the erase operation, a voltage of 0V is applied to the lower gate 25, so that the holes in the floating body 3 can effectively flow into a drain. Accordingly, it is possible to improve the sensing margin. However, the 1T DRAM cell device has the problems as follows. Generally, in the case where the floating body 3 in the double-gate structure has a small thickness and is fully depleted, a width of the body is configured to be small due to its characteristics of suppressing the short channel effect. A threshold voltage in the double-gate structure having a fully-depleted body depends on the thickness of the body and a doping concentration of the body. Although a fully-depleted cell device can be actually manufactured, a variation in the threshold voltage among the cell devices may be greatly increased. Therefore, it is difficult to implement a practical cell device. In addition, since the lower gate electrode 25 are independently provided to each cell device, there is a problem in that a degree of integration of the cell devices is greatly decreased in a layout of a cell device array.

FIG. 2B illustrates another example of an existing 1T DRAM cell device having a double-gate structure disclosed in an article "Floating Body DRAM Characteristics of Silicon-On-ONO (SOONO) devices for System-on-Chip (SoC) Applications" (in VLSI Tech., Dig., 2007, pp. 168-169.) by Chang Woo Oh et al., of Samsung electronics. In the cell device, an existing bulk silicon substrate is used as a substitute for an SOI substrate, and an SiGe layer is used as a sacrificial layer so as to implement a floating body 3. In FIG. 2B, spaces filled with a fourth insulating layer 21 and a first nitride layer 22 are the regions where the SiGe layer initially exists. A thickness of the insulating layers is about 50 nm. In the cell device, in order to obtain the double-gate effect, the substrate 1 is used like a lower electrode. Although the sensing margin can be improved due to the double-gate effect, the 1T DRAM cell device has the problems as follows. Firstly, since a thickness (about 50 nm in this example) of the insulating layer formed between the substrate 1 and the floating body 3 is too large, a high voltage of about −5V needs to be always applied so as to store the generated holes in the floating body 3. The thickness of the insulating layer may be reduced by reducing a thickness of the sacrificial layer of the SiGe layer in the cell device manufacturing processes. However, if the thickness is reduced, much difficulty is involved with the processes. Secondly, in the case where the substrate 1 is used as a common lower gate electrode for all cell devices, so that it is impossible to apply a bias to only a specific cell device or to only cell devices within a specific area. In addition, if the lower gate electrodes 7 are formed, in order to localize each of the lower gate electrodes 7 to each of the cell devices, that is, in order to electrically independently form the lower gate electrodes, wells may be formed in the substrate 1. However, in this case, since an interval between the wells needs to be enlarged, a degree of integration is greatly decreased. Thirdly, as described in FIG. 2A, since the fully-depleted floating body needs to be used, there is an essential problem in that a dispersion of read currents among the cell devices is increased.

FIG. 2C illustrates still another example of a double-gate structure disclosed in an article "Scaling of Flash NVRAM to 10's of nm by Decoupling of Storage from Read/Sense Using Back-Floating Gates," (IEEE Trans. on Nanotechnology, vol. 1, no. 4, pp. 247-254, December 2002) by Arvind Kumar et al, in Cornell University. The double-gate structure is contrived for applications of an existing flash memory other than a 1T DRAM cell device. According to the disclosed article, write and erase operations are performed by storing or removing charges in or from a floating storage node 24 through a bottom electrode 23, and a memory storage state is read by using an upper gate electrode 11. However, according to the disclosed article, a change in threshold voltage during the write and erase operations of the cell device is not good. Although this structure is contrived for a flash device, the structure may be adapted to a 1T DRAM cell device. However, there is not disclosed a 1T DRAM cell device using this structure. If the structure is directly adapted to the 1T DRAM cell device, there are problems as follows. Firstly, since a thickness of an insulating layer interposed between a floating body 3 and a bottom electrode 23 having an effect of a lower electrode is too large, a very high voltage needs to be applied to the bottom electrode 23 so as to obtain the double-gate effect. If a thickness of insulating layers on and under a floating storage node 24 is decreased so as to reduce the voltage, the cell device cannot be operated as an appropriate flash memory. In particular, since the floating storage node 24 in the disclosed structure is a conductive layer, a thickness of a tunneling insulating layer disposed thereon needs to be at least about 7 nm so as not to lose information. Secondly, since the bottom electrodes 23 formed in the substrate 1 are not electrically isolated between the cell devices, a lower electrode effect for a specific cell device or for a plurality of cell devices within a specific area cannot be reduced. In the disclosed document, in a method of forming the bottom electrode, a heavily-doped substrate or a substrate of which the upper portion is heavily doped is used. In other words, the bottom electrode 23 is formed by doping the substrate 1 with impurities. In this case, since an interval between the bottom electrodes 23 of the cell devices needs to be enlarged so as to electrically independently provide the bottom electrodes 23 to the cell devices, there is a problem in that a degree of integration in an array of the cell devices is greatly decreased. Thirdly, as described above with reference to FIGS. 2A and 2B, since the dispersion of the threshold voltages among the cell devices having fully-depleted floating body 3 is too large, it is difficult to practically implement the 1T DRAM cell device.

FIG. 2D illustrates an example of a double-gate structure having a non-volatile function disclosed in Korean Patent Application No. 10-2007-0086516 by Kyungpook National University. In the invention, a gate electrode 11 and a control electrode 7 are formed on and under a semiconductor layer where a source 8, a drain 9, and a floating body 3 are formed, so that a double-gate structure having an excellent miniaturization characteristic is implemented. The lower control electrode 7 is surrounded by a so-called gate stack. The gate stack is constructed with a tunneling insulating layer 4, a charge storage node 5, and a blocking insulating layer 6, and the control electrode 7 has the same function as a control electrode of an existing non-volatile memory device. In other words, according to a bias condition to the control electrode 7, write or erase operation can be performed on the charge storage node 5. In the case where a fully-depleted floating body is formed, if charges are stored through the control electrode 7 in the charge storage node 5, good miniaturization characteristic of the cell device can be obtained; a dispersion of the threshold voltage can be reduced by adjusting a charge amount of the charge storage node 5; a degree of integration of an array of cell devices can be improved by commonly using the control electrode 7; the performance of DRAM can be improved by adding a memory function to the write, erase, and read operations. However, since the source 8 and the drain 9 are formed so as to be in contact with the gate stack, there occur problems in the "write 0" characteristic and the retention characteristic. In order to describe the problems, an n-type FET device is assumed. Since the cell device is an n-type FET device, the regions of the source 8 and the drain 9 are doped with $n^+$ type impurities. Since holes need to be accumulated in the lower portion of the floating body 3 in order to improve the performance of the cell device, negative charges need to be stored in the charge storage node 5 of the gate stack, or a negative voltage needs to be applied to the control electrode 7. Under the condition for accumulating the holes, large band bending occurs in the regions of the source 8 and the drain 9 which are overlapped with the gate stack, and due to band-to-band tunneling, electron-hole pairs are generated. The electrons flow into the drain 9, and the holes are stored in the floating body 3. As a result, there are problems in that the "write 0" characteristic and the retention characteristic deteriorate. Due to the problems, the length of the control electrode 7 and the length of the gate stack surrounding the control electrode 7 cannot be configured to be large. Accordingly, the capacitance of the floating body 3 is reduced, so that the sensing margin and the retention time characteristic deteriorate.

SUMMARY OF THE INVENTION

The invention provides a 1T DRAM cell device having a double-gate structure having a non-volatile function, capable of suppressing generation of electron-hole pairs and improving a sensing margin and a retention time by configuring a junction depth so that a source and a drain are not in contact with a gate stack.

The invention also provides a 1T DRAM cell device capable of improving a degree of integration, reducing a dispersion of threshold voltages of cell devices by using a non-volatile memory function, increasing cell capacitance of a floating body by increasing a size of a control electrode, and improving a sensing margin between "write 1" and "write 0" operations and a retention time of the cell device.

According to an aspect of the present invention, there is provided a one-transistor (1T) floating-body DRAM cell device including: a substrate; a gate stack which is formed on the substrate; a control electrode which is disposed on the substrate and of which some or entire portion is surrounded by the gate stack; a semiconductor layer which is formed on the gate stack; a source and a drain which are formed on the semiconductor layer and of which lower surfaces are not in contact with the gate stack; a gate insulating layer which is formed on the semiconductor layer; and a gate electrode which is formed on the gate insulating layer, wherein the remaining portion of the semiconductor layer excluding the source and the drain is configured as a floating body.

In the above aspect, the gate stack may be constructed with a tunneling insulating layer or a blocking insulating layer, wherein the gate stack is constructed with the tunneling insulating layer and a charge storage node, wherein the gate stack is constructed with the charge storage node and the blocking insulating layer, wherein the gate stack is constructed with the tunneling insulating layer and the blocking insulating layer, or wherein the gate stack is constructed with the tunneling insulating layer, the charge storage node, and the blocking insulating layer.

In addition, the 1T floating-body DRAM cell device may further include a well which is formed by doping the substrate with impurities of which type is different from that of impurities of the substrate, wherein the well is used as a substrate electrode so as to control a specific cell device.

In addition, the control electrode and the gate stack may be formed under the entire portions of the floating body or under some portions of the semiconductor layer including an area where a channel of the floating body is formed, and wherein, in the case where the control electrode and the gate stack are formed under some portions of the floating body, an additional insulating layer is formed on a side surface of the control electrode and on a side surface of the gate stack surrounding the control electrode.

In addition, some portions of the semiconductor layer may be formed so as not to be overlapped with the control electrode, wherein the source and drain regions that are formed on the areas that are not overlapped with the control electrode have deeper junctions than the source and drain regions that are formed on the areas that are overlapped with the control electrode.

In addition, the 1T floating-body DRAM cell device may further include spacers which are formed on two side surfaces of the gate electrode and are constructed with an insulating layer, wherein the source and the drain are formed by selectively growing an epitaxial layer on the area of the semiconductor layer excluding the gate electrode and the areas where the spacers are formed.

In addition, the 1T floating-body DRAM cell device according to claim 1, further comprising an isolation insulating layer which is formed on some or entire side surfaces of the gate stack and the semiconductor layer so as to isolate the cell device from adjacent cell devices, or an isolation insulating layer may formed on some or entire portions of side surfaces of the gate stack and the semiconductor layer excluding one side surface, wherein the one side surface where the isolation insulating layer is not formed is commonly used by the source or the drain and by a source or a drain of an adjacent cell device.

In addition, a region of the semiconductor layer between the source and the gate stack and a region of the semiconductor layer between the drain and the gate stack may be doped with impurities of which type is the same as that of the source and the drain, wherein a concentration of doped impurities of the regions of the semiconductor layer is lower than those of the source and the drain. In particular, the region of the semiconductor layer between the source and the gate stack and the region of the semiconductor layer between the drain and the gate stack may be doped by charges that are charged in the charge storage node of the gate stack or by a voltage that is applied to the gate electrode with such a concentration of impurities that carriers of which type is opposite to that of majority carriers of the source and the drain can be formed in the region of the semiconductor layer on the gate stack.

According to the invention, in the double-gate structure where the gate stack is not in contact with the source and the drain, the upper gate electrode is configured as a gate of a general MOS cell device, and the lower control electrode is configured to have a non-volatile function. Accordingly, the sensing margin and the retention characteristic of the cell device can be improved, and the miniaturization characteristic can be improved. In addition, a dispersion of the threshold voltages can be reduced by adjusting a charge amount of the charge storage node. In addition, a degree of integration of an array of cell devices can be improved by commonly using the control electrode. In addition, the performance of DRAM can be improved by adding a memory function to the write, erase, and read operations.

BRIEF DESCRIPTION OF THE DRAWINGS

The above and other features and advantages of the invention will become more apparent by describing in detail exemplary embodiments thereof with reference to the attached drawings in which:

FIGS. 1A and 1B are cross-sectional views illustrating existing 1T DRAM cell devices implemented on an SOI substrate in the related art so as to illustrate miniaturization in gate length.

FIGS. 2A to 2D are cross-sectional views illustrating existing 1T-DRAM cell devices having a double-gate structure.

FIG. 3A is a cross-sectional view illustrating a 1T DRAM cell device according to a first embodiment of the invention, and FIG. 3B is a cross-sectional view illustrating a 1T DRAM cell device according to a second embodiment of the invention.

FIG. 4A illustrates a 1T DRAM cell device of which a charge storage node is constructed with a continuous layer, and FIG. 4B illustrates a 1T DRAM cell device of which a charge storage node is constructed with nano-sized dots.

DETAILED DESCRIPTION OF THE INVENTION

In the invention, in order to achieve the aforementioned objects, a junction structure where regions of a source and a drain are not in contact with an underlying gate stack is introduced to a structure of a 1T DRAM cell device where a gate electrode for a MOSFET operation and a control electrode for a non-volatile memory operation are formed on and under a semiconductor layer where the source, the drain, and a floating body are formed.

1T DRAM Cell Device

Figure 3A:
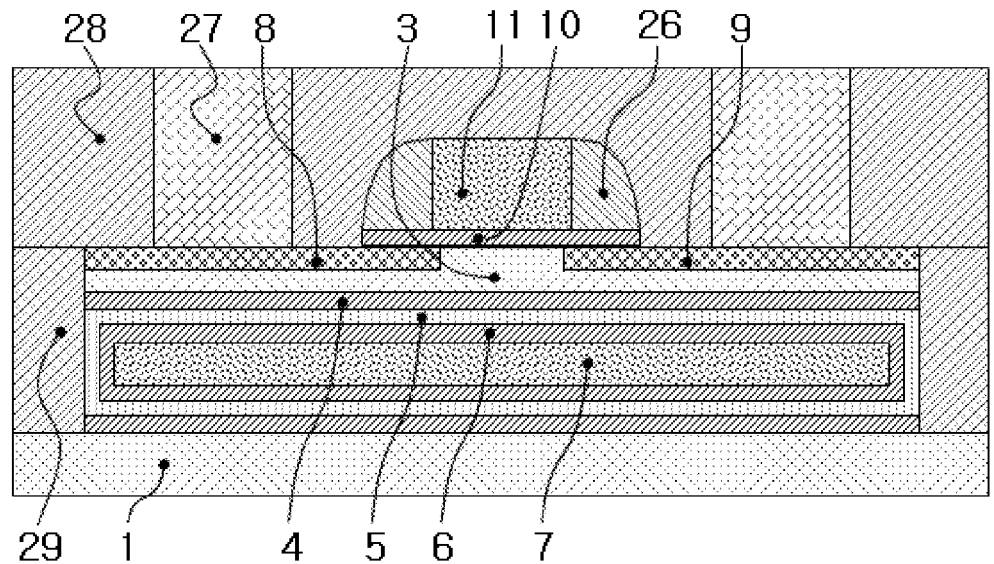
FIGS. 3A and 3B are cross-sectional views illustrating 1T DRAM cell devices provided with a device isolation area according to the invention.
Figure 3B:
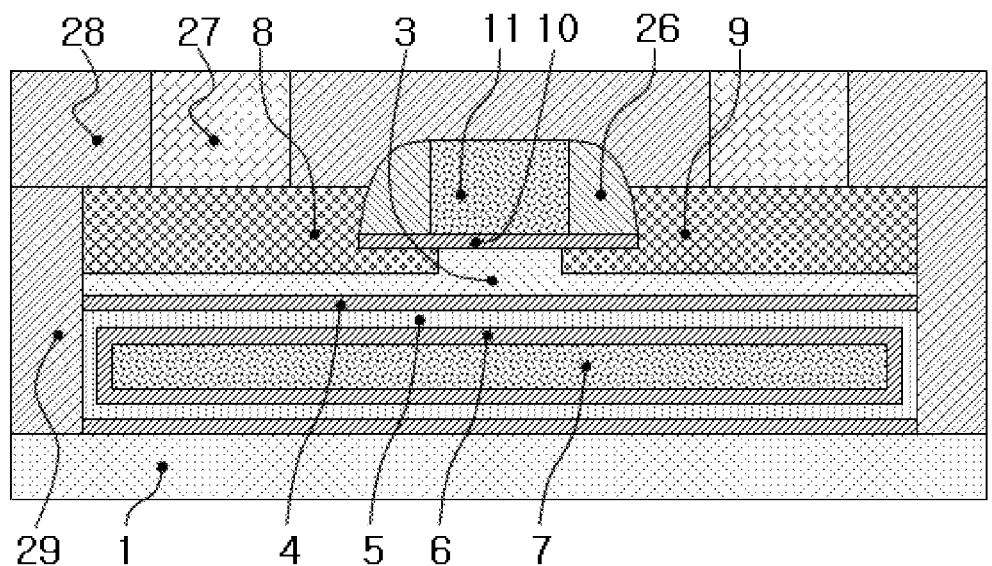

A structure of a 1T DRAM cell device according to a first embodiment of the invention is described with reference to FIGS. 3A and 3B. For the better understanding, main components are illustrated in the figure. FIG. 3A is a cross-sectional view illustrating a structure of a 1T DRAM cell device according to a first embodiment of the invention, and FIG. 3B is a cross-sectional view illustrating a structure of a 1T DRAM cell device according to a second embodiment of the invention. The 1T DRAM cell device according to the first embodiment of the invention includes a substrate 1, a gate stack 4, 5, and 6 formed on the substrate 1, a control electrode 7 of which some or entire portion is surrounded by the gate stack, a floating body 3 formed on the gate stack, a source 8 and a drain 9 formed above the floating body 3, a gate insulating layer 10 formed on the floating body 3, and a gate electrode 11 formed on the gate insulating layer 10. The gate stack is constructed with a tunneling insulating layer 4, a charge storage node 5, and a blocking insulating layer 6.

The floating body 3, the source 8 and the drain 9 are formed in a semiconductor layer. The source 8 and the drain 9 are formed by doping impurities in an upper surface of the semiconductor layer. The remaining portion of the semiconductor layer excluding the source 8 and the drain 9 is configured as the floating body 3. Preferably, the junctions of the source 8 and the drain 9 are formed so that the source 8 and the drain 9 are not in contact with an upper surface of the gate stack. The gate electrode 11 and the control electrode 7 are formed above and under the semiconductor layer where the source 8, the drain 9, and the floating body 3 are formed, so that a double-gate structure having an excellent miniaturization characteristic is implemented. In the structure of the invention, since the gate electrode 11 is formed above and the control electrode 7 is formed below, the gate electrode 11 and the control electrode 7 are sometimes referred to as an upper gate electrode and a lower control electrode, respectively. In the 1T DRAM cell device according to the first embodiment of the invention, the source 8 and the drain 9 are formed so that the source 8 and the drain 9 are not in contact with the underlying tunneling insulating layer 4 of the gate stack.

In the 1T DRAM cell device according to the embodiment, the gate stack is formed on the substrate 1, and the control electrode 7 is formed so that the control electrode 7 is partially or entirely surrounded by the gate stack. The semiconductor layer is formed on the gate stack, and the gate insulating layer 10 and the gate electrode 11 are formed thereon. Spacers 26 are formed on the two side surfaces of the gate electrode 11. The spacers 26 may also be omitted. A fifth insulating layer 28 is formed, and all the areas of the insulating layer where contacts are to be formed are removed. Contact epitaxial layer 27 is selectively formed on the contact area. The contact epitaxial layer 27 may be doped with impurities of which type is the same as those of the source 8 and the drain 9 by using an in-situ method. Isolation insulating layers 29 are formed on two side surfaces of the gate stack and on two side surfaces of the semiconductor layer so as to isolate the cell device.

The semiconductor layer used in the 1T DRAM cell device according to the invention is thinner than a semiconductor layer used in an existing 1T DRAM cell device using a partially depleted (PD) SOI. The source 8, the drain 9, and the floating body 3 are formed in the semiconductor layer. Although the miniaturization characteristic of the cell device is improved due to the thin semiconductor layer, the performance of the cell device greatly deteriorates due to the small capacitance of the floating body 3. In order to solve the problem, majority carriers (in case of the cell device constructed with n-type FET, the floating body is of the p type, and the majority carriers are holes) are induced to a lower portion of the floating body 3 by storing charges in the charge storage node 5 for the gate stack, which is formed in the lower portion of the floating body 3, or by applying a voltage to the control electrode 7. In the description hereinafter, the 1T DRAM cell device is assumed to have an n-type FET structure. At this time, if the source 8 and the drain 9 are in contact with the underlying gate stack with a high concentration, electron-hole pairs are generated due to the band-to-band tunneling. The generated electrons flow into the drain 9 and the generated holes are stored in the floating body 3. The "write 0" state where majority carriers are depleted in the floating body 3 greatly deteriorates due to the holes. In addition, even under the condition that the "write 0" state is retained, the retention characteristic greatly deteriorates. The junctions between the floating body 3 and the source 8 and between the floating body 3 and the drain 9 are defined by a difference in the impurities. In addition, the junctions are formed by a difference in concentration of the holes induced to the interface between the floating body 3 and the gate stack.

In the 1T DRAM cell device according to the first embodiment, the thickness of the semiconductor layer needs to be small, and in this case, the junctions to the source 8 and the drain 9 need to be very shallow. These requirements are vary difficult to satisfy in terms of the manufacturing processes, and parasitic resistance of the source 8 and the drain 9 is increased. The second embodiment of the invention is implemented in order to solve the above problem of the first embodiment. FIG. 3B is a cross-sectional view illustrating a 1T DRAM cell device according to the second embodiment. As shown in FIG. 3B, the thickness of the semiconductor layer in the vicinity of the formed channel is configured to be small, so that the miniaturization characteristic is improved. In the areas where the source 8 and the drain 9 are formed, the epitaxial layers are selectively grown, so that the thickness of the semiconductor layer is allowed to be large. In this case, the junctions of the source 8 and the drain 9 are configured to be deeper, so that the manufacturing processes can be easily performed and the characteristics of the cell device can be improved. The epitaxial layers are doped with impurities of which type is the same as those of the source 8 and the drain 9 by using an in-situ method.

As shown in FIGS. 3A and 3B, in the 1T DRAM cell devices according to the first and second embodiments, after the fifth insulating layer 28 is formed, the contact area is formed (by filling the area 27 in FIGS. 3A and 3B), and an additional epitaxial layer may be selectively grown in the contact area. The epitaxial layer formed on the contact area may be doped with impurities of which type is the same as those of the source 8 and the drain 9 by using an in-situ method. In addition, in the 1T DRAM cell devices according to the invention, as shown in FIGS. 3A and 3B, the gate stack and the control electrode 7 are formed under the entire portion of the semiconductor layer. In general, in the structure of the 1T DRAM cell device according to the invention, the control electrode 7 and the gate stack surrounding the control electrode 7 are configured to be long, so that the characteristics of the 1T DRAM cell device are improved. As can be understood from the aforementioned structure, the characteristics of the cell device can be effectively improved without an increase in a size of the cell device.

Figure 4A:
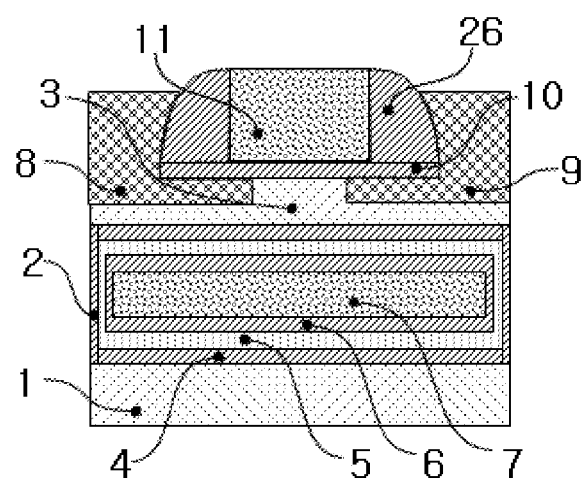
FIGS. 4A and 4B are cross-sectional views illustrating structures of 1T DRAM cell devices according to a third embodiment of the invention, where
Figure 4B:
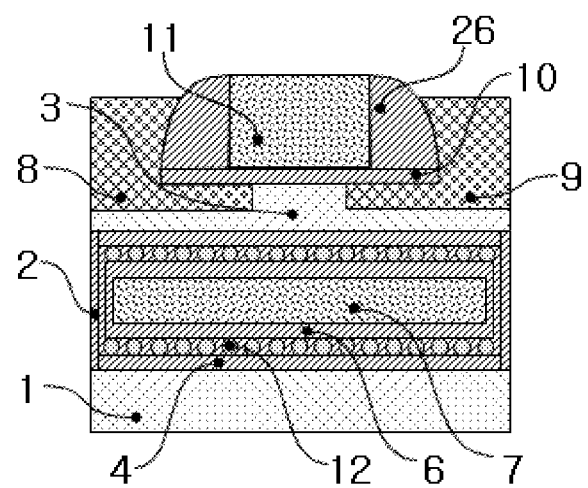

FIGS. 4A and 4B are cross-sectional views illustrating structures of 1T DRAM cell devices according to a third embodiment of the invention. The structure of the 1T DRAM cell device according to the third embodiment is similar to the structure of the 1T DRAM cell device according to the second embodiment. For the convenience of the description, in FIGS. 4A and 4B, the isolation insulating layer 29 for isolation of the cell device, and the fifth insulating layer 28, the contact epitaxial layer 27, and the like are omitted, so that the structure is simply illustrated. In the 1T DRAM cell device according to the third embodiment, the length of the gate stack surrounding the control electrode 7 is configured to be smaller than that of the structure shown in FIGS. 3A and 3B. In addition, in FIG. 4A, the charge storage node 5 is constructed with a continuous layer; and in FIG. 4B, a charge storage node 12 is constructed with nano-sized dots 12.

In the 1T DRAM cell device according to the invention, as shown in FIGS. 3A, 3B, 4A, and 4B, the lower control electrode 7 is surrounded by the gate stack. The gate stack is constructed with a tunneling insulating layer 4, a charge storage node 5, and a blocking insulating layer 6. Although not shown, in an alternative configuration, the gate stack may be constructed with the tunneling insulating layer 4 and an insulating charge storage node. In case of using an SOI (Silicon On Insulator) wafer, buried insulating layers 2 are disposed on the left and right sides of the gate stack. Under the assumption that the tunneling insulating layer 4 is not formed in the buried insulating layer in a thermal oxidation method, the buried insulating layers 2 are not shown in FIGS. 3A, 3B, 4A, and 4B. If a CVD (chemical vapor deposition) method, an ALD (atomic layer deposition) method or the like other than the thermal oxidation method is used, the buried insulating layer can be necessarily formed in the tunneling insulating layer 4. The tunneling insulating layer 4 may be constructed with one insulating layer or with two or more insulating layers having different work functions or band gaps. The charge storage node 5 may be constructed with a conductive or insulating layer. In addition, as shown in FIG. 4B, the charge storage node 5 may be constructed with conductive or insulating nano-sized dots 12. The blocking insulating layer may be constructed with one layer or with two or more layers having different work functions or band gaps.

The control electrode 7 may be constructed with one or two or more of materials having various work functions such as a conductive semiconductor, a metal, a metal oxide, a silicide, a two-element metal, a metal nitride (for example, TaN, TiN, or WN). The control electrode 7 can function as a control electrode of a non-volatile memory device. In other words, the control electrode 7 can perform write and erase operations on the charge storage node 5 according to a bias condition of the control electrode 7. In case of a fully-depleted floating body, if charges are stored in the charge storage node 5 through the control electrode 7, performances of the cell device can be greatly improved.

If a surface area of the semiconductor substrate 1 is doped with a high concentration, or if a total concentration of the semiconductor substrate 1 is increased, the semiconductor substrate 1 can be used as a substrate electrode for improving performances of the cell device. The substrate electrode may be connected through a contact to an external metal interconnection line. The write and erase operations on the charge storage node 5 can be performed through the substrate electrode, so that additional performances can also be improved. Particularly, the write and erase operations can also be performed by adjusting voltages of the substrate electrode and the lower control electrode 7.

Preferably, the control electrode 7 and the gate stack surrounding the control electrode 7 are formed so as to be overlapped with the floating body 3 in a long portion. In this case, due to the control electrode 7, the charges stored in the charge storage node 5 have a function of effectively holding holes (in case of an NMOS device) generated in the floating body 3 in the body region, so that sensing margin can be increased.

The gate electrode 11 may be constructed with one or two or more of materials having various work functions such as a conductive semiconductor, a metal, a metal oxide, a silicide, a two-element metal, a metal nitride (for example, TaN, TiN, or WN). The gate electrode 7 may be constructed with conductive materials having various work functions. The work function of the control electrode 7 may be designed to be higher than that of the gate electrode 11. As an example, a 1T DRAM cell device having the gate electrode 11 constructed with an n+ polysilicon and the control electrode 7 constructed with a p+ polysilicon is described in brief. The threshold voltage can be maintained not to be in a high value due to the n+ polysilicon gate, so that a write operation current can be ensured at a low voltage. Particularly, the p+ polysilicon control electrode 7 has an advantage of collecting holes (in case of an NMOS device) in the floating body 3. In addition, in the case where the electrons are stored in the charge storage node 5 through the control electrode 7, a retention time and sensing margin can be greatly improved due to the high work function of the control electrode 7.

Figure 5A:
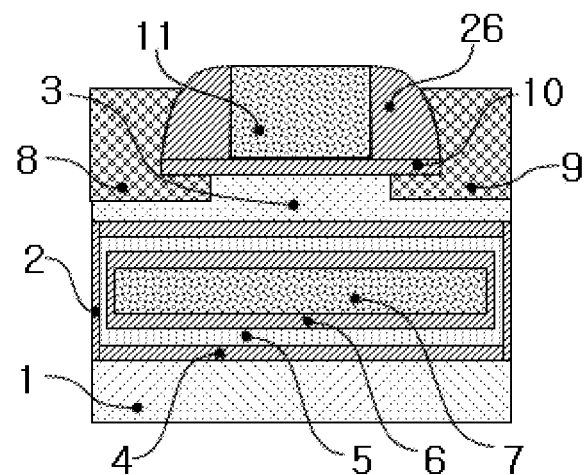
FIGS. 5A and 5B are cross-sectional views illustrating structures of 1T DRAM cell devices according to a fourth embodiment of the invention.
Figure 5B:
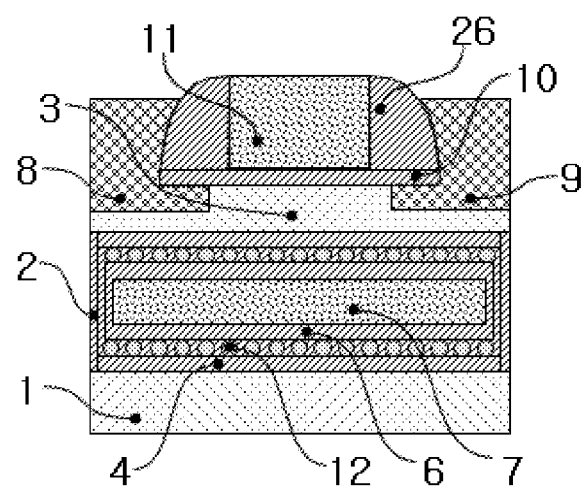

FIGS. 5A and 5B are cross-sectional views illustrating structures of 1T DRAM cell devices according to a fourth embodiment of the invention. The structure of the 1T DRAM cell device according to the fourth embodiment is similar to the structure of the 1T DRAM cell device according to the third embodiment except for the following different point. Unlike the third embodiment, in the 1T DRAM cell device according to the fourth embodiment, the gate electrode 11 is formed so as not to be overlapped with the source 8 and the drain 9. Other features of the fourth embodiment are the same as those of the third embodiment. In this manner, if the source 8 and the drain 9 are formed so as not to be overlapped with the gate electrode 11, the area of the floating body 3 in the vicinity of the channel can be formed to be large. This configuration will be advantageous to improvement of the characteristics of the cell device including the retention characteristic.

Figure 6:
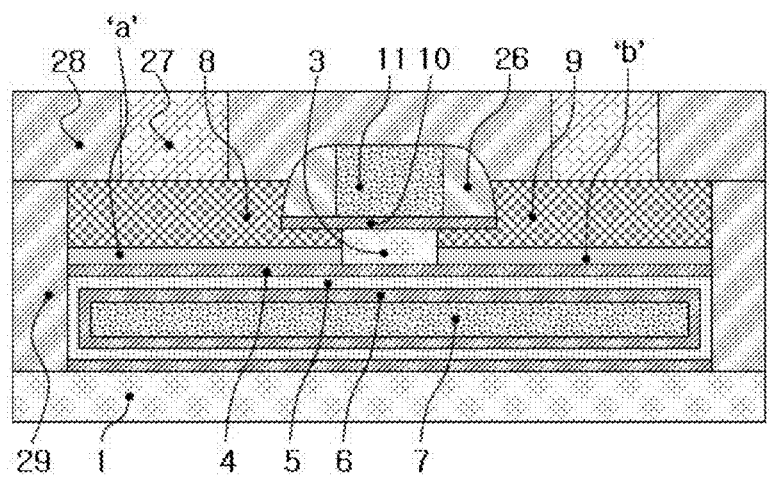
FIG. 6 is a cross-sectional view illustrating a structure of a 1T DRAM cell device according to a fifth embodiment of the invention.

FIG. 6 is a cross-sectional view illustrating a structure of a 1T DRAM cell device according to a fifth embodiment of the invention. As show in FIG. 6, the structure of the 1T DRAM cell device according to the fifth embodiment is similar to the structure of the 1T DRAM cell device according to the second embodiment except for the following different point. Unlike the second embodiment, in the 1T DRAM cell device according to the fifth embodiment, the semiconductor layer "a" formed between the source 8 and the gate stack and the semiconductor layer "b" formed between the drain 9 and the gate stack are doped with impurities of which type is the same as that of the source 8 and the drain 9, and the concentration of the doped impurities thereof is lower than those of the source 8 and the drain 9. In particular, preferably, the regions of the semiconductor layers "a" and "b" are doped by charges that are charged in the charge storage node 5 of the gate stack or by the voltage that is applied to the control electrode 7 with such a concentration of impurities that an inversion layer can be formed under the regions of the semiconductor layers "a" and "b" on the gate stack. The configuration of the embodiment where the regions of the semiconductor layer between the source 8 and gate stack and the semiconductor layer between the drain and the gate stack are doped with a lower concentration of impurities than the concentrations of the source 8 and the drain 9 can be adapted to the first, third, and fourth embodiments.

Figure 7:
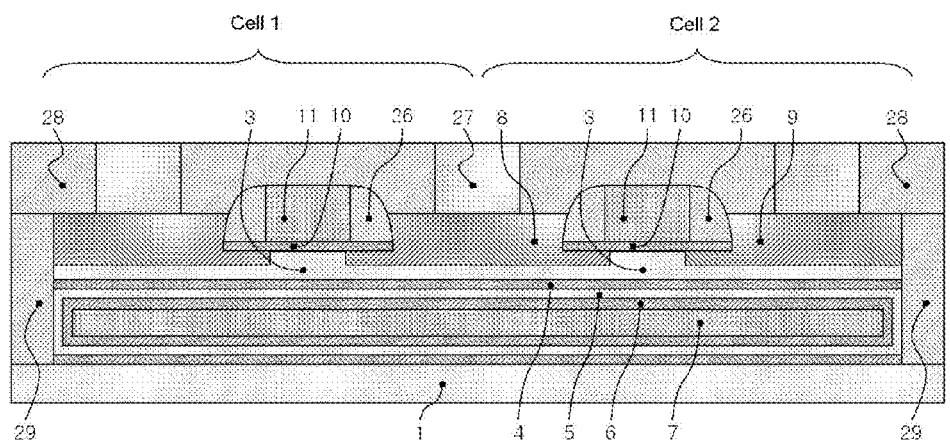
FIG. 7 is a cross-sectional view for explaining device isolation and commonly used source or drain between adjacent cell devices in an array of 1T DRAM cell devices according to the second embodiment of the invention.

FIG. 7 is a cross-sectional view illustrating an example of an array of the 1T DRAM cell devices according to the second embodiment of the invention shown in FIG. 3B. Referring to FIG. 7, the source 8 is commonly used by two adjacent cell devices Cell 1 and Cell 2, so that a degree of integration of the cell device array can be increased. Isolation insulating layers 29 are formed on the left and right sides of the two cell devices as one unit so as to isolate the two cell devices from others. Although the source 8 is commonly used in FIG. 7, the drain 9 may be commonly used if needed.

Method of Manufacturing 1T DRAM Cell Device

Hereinafter, a method of manufacturing the aforementioned 1T DRAM cell device according to the invention is described. FIGS. 8A to 8F and FIGS. 9A to 9F are cross-sectional views illustrating main processes of an example of a manufacturing method for implementing a cell device according to the invention.

Figure 8A:
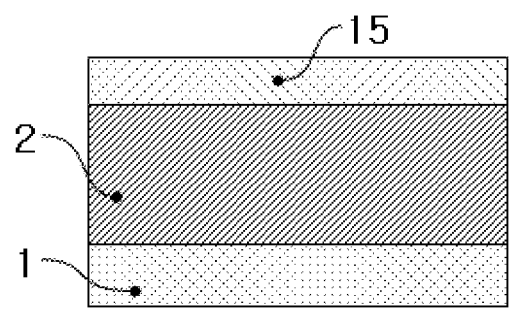
FIGS. 8A to 8F are cross-sectional views illustrating main processes of a method of manufacturing a 1T DRAM cell device according to an embodiment of the invention by using an SOI (Silicon On Insulator) substrate.
Figure 8B:
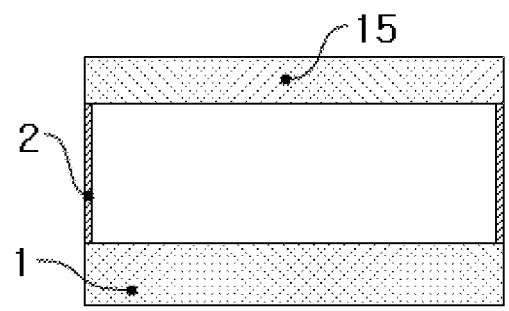
Figure 8C:
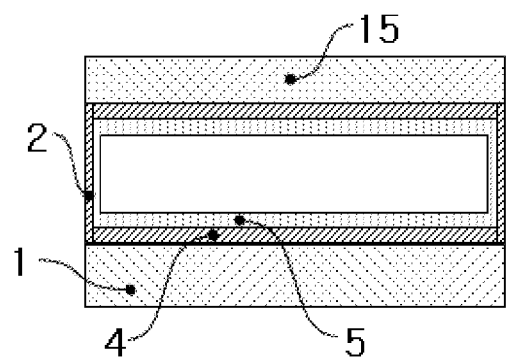
Figure 8D:
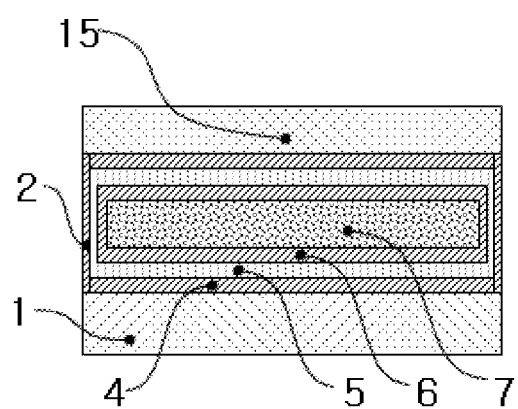
Figure 8E:
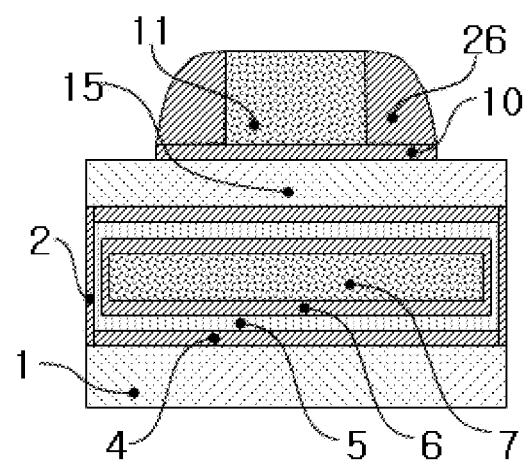
Figure 8F:
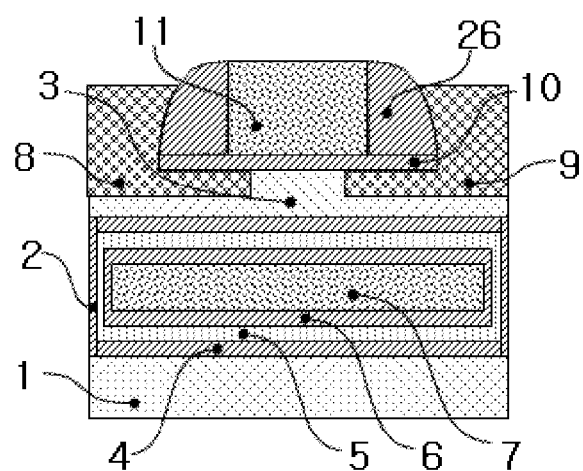

FIGS. 8A to 8F illustrate an example of a manufacturing method using an SOI (Silicon On Insulator) wafer. As shown in FIG. 8A, a buried insulating layer 2 is formed on an SOI substrate 1, and a single-crystalline silicon layer 15, where a source 8, a drain 9, and a floating body 3 of a cell device are to be formed, is defined on the buried insulating layer 2. Next, as shown in FIG. 8B, in the buried insulating layer 2 under the single-crystalline silicon layer 15, the portions thereof under some or entire portions of the portions where the source 8, and the drain 9, and the floating body 3 are to be formed are selectively removed by using a mask to form under-cut. Next, as shown in FIG. 8C, a tunneling insulating layer 4 and a charge storage node 5 are formed. Next, as shown in FIG. 8D, a blocking insulating layer 6 and a control electrode 7 are formed. Next, as shown in FIG. 8E, a gate insulating layer 10 and a gate electrode 11 are sequentially formed on the semiconductor layer 15 where the source 8, and the drain 9, and the floating body 3 are to be formed, and spacers 26 are formed on two side surfaces of the gate electrode 11. In this step, regions of the source 8 and the drain 9 may be formed. FIG. 8F illustrates a cross section where epitaxial layers are selectively grown only on the exposed regions of the source 8 and the drain 9. In the epitaxial layer growing process, at the same time of the growing, the epitaxial layers may be doped with impurities of which types are the same as those of the source 8 and the drain 9. FIGS. 8A to 8F illustrate cross sections of the main structure of the 1T DRAM cell device according to the invention. In the following processes, additional insulating layers are formed; contact areas are formed; and a metal interconnection line process is performed.

FIGS. 9A to 9F illustrate an example of a manufacturing method using a bulk silicon wafer.

Figure 9A:
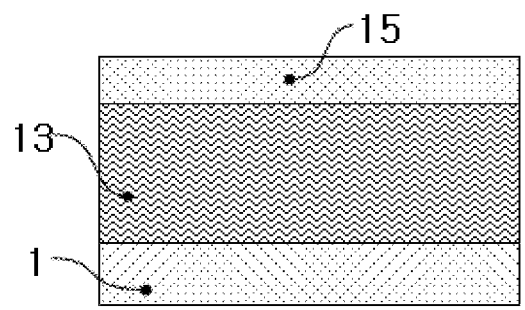
FIGS. 9A to 9F are cross-sectional views illustrating main processes of a method of manufacturing a 1T DRAM cell device according to another embodiment of the invention by a substrate that is formed by growing a material such as SiGe different etch ratio on a bulk silicon substrate and growing a single-crystalline silicon layer thereon.

First, as shown in FIG. 9A, a single-crystalline SiGe layer 13 and a Si layer 15 are sequentially formed on the bulk silicon substrate 1. A cell device width for a cell device is defined, and the single-crystalline SiGe layer 13 and the Si layer 15 are etched. Next, the SiGe layer 13 in the area where the cell device is to be formed is selectively removed, and the removed region may be filled with an insulating layer. The manufacturing processes of forming the cell device in the region which is filled with the insulating layer instead of the SiGe layer may be the same as those described in FIGS. 8A to 8F. In addition, manufacturing processes using an alternative method are described with reference to FIGS. 9A to 9F.

Figure 9B:
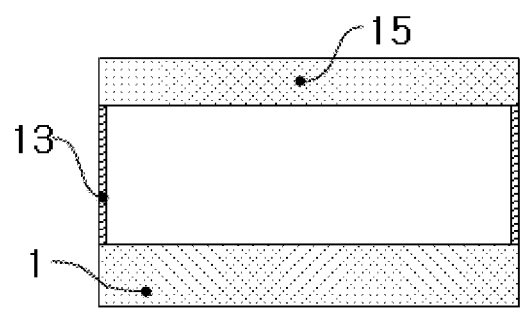
Figure 9C:
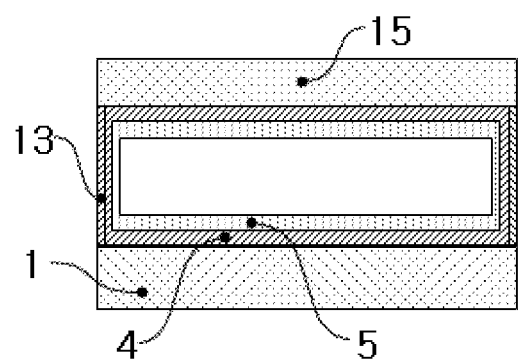
Figure 9D:
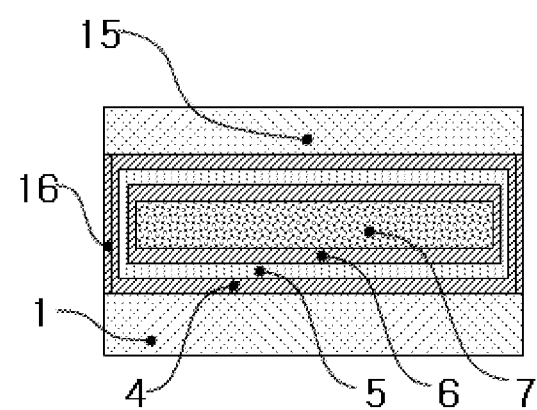
Figure 9E:
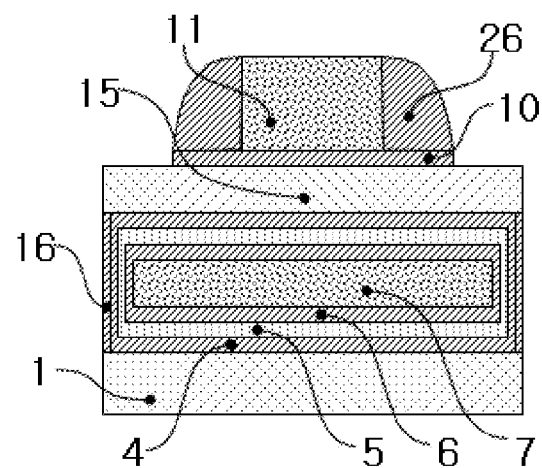
Figure 9F:
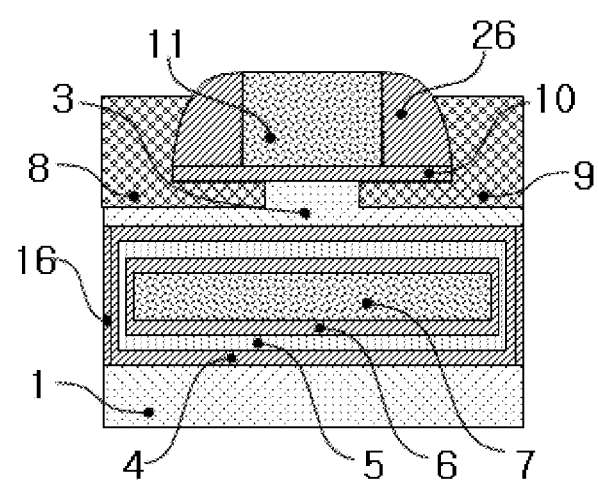

As shown in FIG. 9A, the single-crystalline SiGe layer 13 and the Si layer 15 are formed on the bulk silicon substrate 1. The single-crystalline SiGe layer 13 and the Si layer 15 are etched so as to isolate the cell device from adjacent cell devices. Next, as shown in FIG. 9B, some regions of the single-crystalline SiGe layer 13 under the Si layer 15 are selectively removed. More specifically, some or entire portions of the single-crystalline SiGe layer 13 under the Si layer 15, where the previously-defined floating body 3 and some portions of the source 8 and the drain 9 are to be formed, are selectively removed. Next, as shown in FIG. 9C, the tunneling insulating layer 4 and the charge storage node 5 are formed. Next, as shown in FIG. 9D, the blocking insulating layer 6 and the control electrode 7 are formed. In this step, the remaining SiGe layer 13 under the Si layer 15 is selectively removed, and the removed region is filled with a second insulating layer 16. Due to the second insulating layer 16, the regions of the source 8 and the drain 9 are insulated from the bulk silicon substrate 1. Next, as shown in FIG. 9E, the gate insulating layer 10 and the gate electrode 11 are sequentially formed, and the spacers 26 are formed on two side surfaces of the gate electrode 11. In this step, the regions of the source 8 and the drain 9 may be formed. FIG. 9F illustrates a cross section where epitaxial layers are selectively grown only on the exposed regions of the source 8 and the drain 9. In the epitaxial layer growing process, at the same time of the growing, the epitaxial layers may be doped with impurities of which types are the same as those of the source 8 and the drain 9. FIGS. 8A to 8F illustrate cross sections of the main structure of the 1T DRAM cell device according to the invention. In the following processes, additional insulating layers are formed; contact areas are formed; and a metal interconnection line process is performed.

In the aforementioned manufacturing method, the process of forming the control electrode 7 may include a process of forming a material for the control electrode 7 and a process of performing a planarization process by using CMP (Chemical Mechanical Polishing). Next, after the planarization process, an insulating layer is selectively formed on the exposed surface of the control electrode 7.

Figure 10:
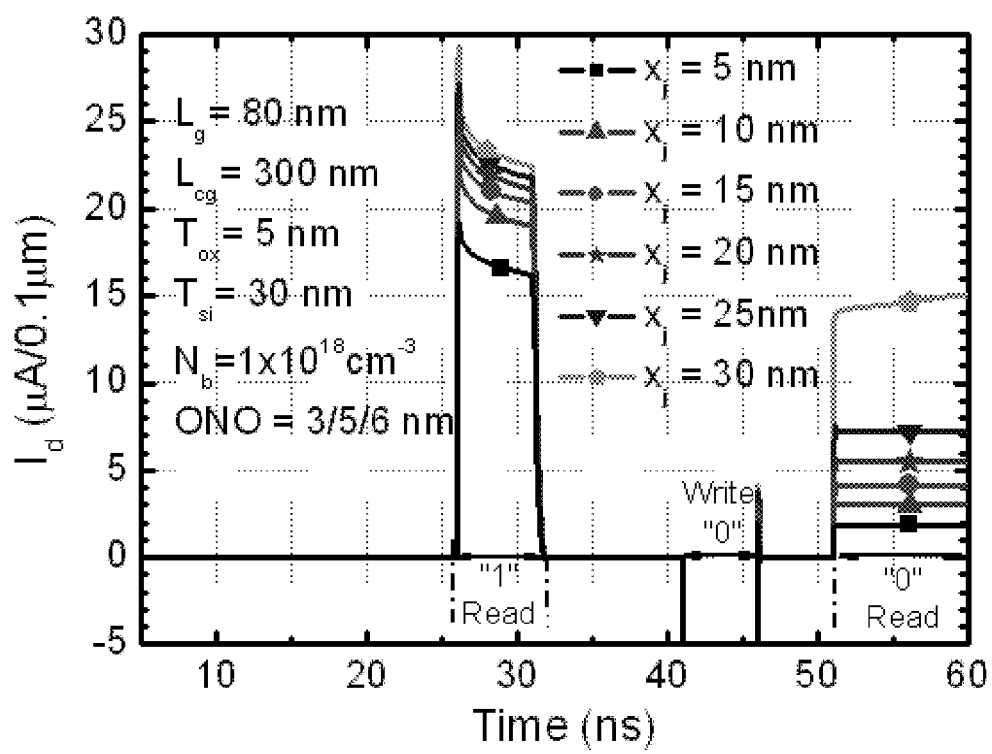
FIG. 10 is a view illustrating a graph of a transient characteristic of a cell device, more specifically, a current characteristic according to "write 1" and "write 0" operations as one of the advantages of the invention.

FIG. 10 illustrates, as an advantage of the 1T DRAM cell device having the double-gate structure according to the invention, cell device characteristics with respect to various junction depths $x_j$ of the source 8 and the drain 9. In FIG. 10, "$x_j$=30 nm" corresponds to the case where the junction depths of the source 8 and the drain 9 are the same as the thickness of the floating body 3.

As the junction depths "$x_j$" are decreased, the separation of the gate stack from the source 8 and the drain 9 is increased. Therefore, the characteristic of the "write 0" state (the state where majority carriers are depleted in the floating body 3) can be improved, and the retention characteristic can be improved. In the case of the junction depth "$x_j$=30 nm", in the read operation after the "write 1" and "write 0" operations, the current difference or the current ratio ("write 1" current/ "write 0" current) can be improved. Accordingly, the sensing margin can be improved.

Figure 11:
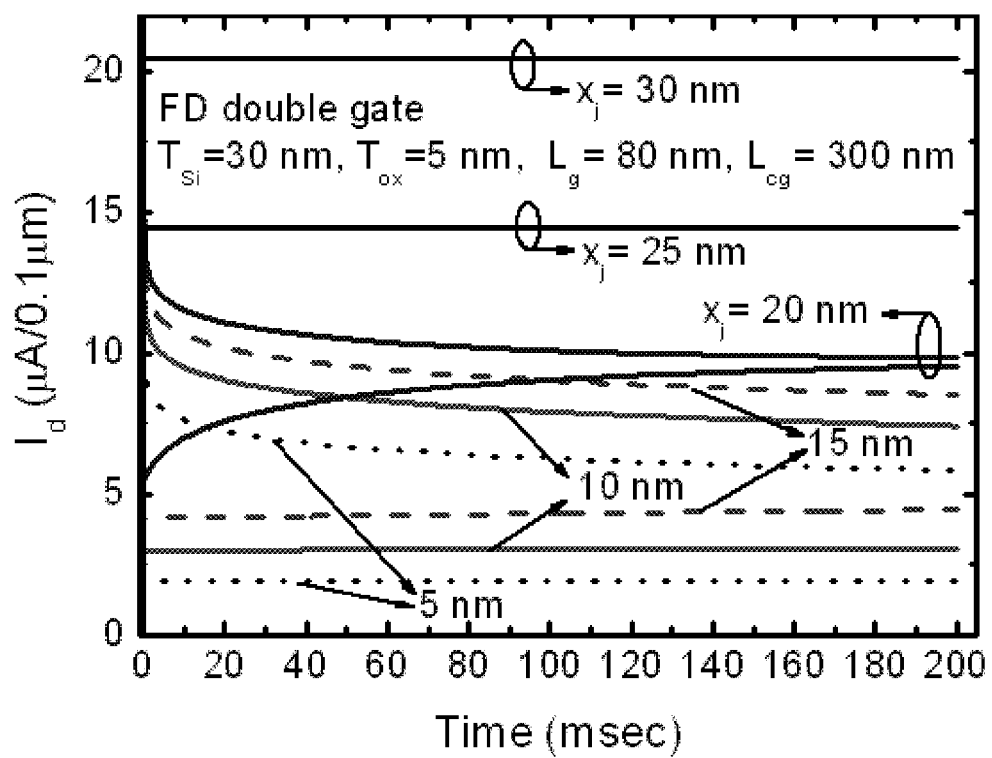
FIG. 11 is a view illustrating a graph of a transient characteristic of a cell device, more specifically, a retention characteristic as one of the advantages of the invention.

FIG. 11 illustrates, as another advantage of the 1T DRAM cell device having the double-gate structure according to the invention, retention characteristics with respect to various junction depths $x_j$ of the source 8 and the drain 9. The retention characteristic of the 1T DRAM cell device constructed with an n-type FET is illustrated. More specifically, the retention characteristic in the state where electrons are stored in the charge storage node 5 of the gate stack is illustrated. It can be understood that, under the condition that the junction depth is "$x_j$=30 nm", the retention characteristic is very bad. As the junction depth "$x_j$" is decreased, the current difference between the "write 1" operation and the "write 0" operation is increased. Therefore, it can be understood that the retention characteristic is greatly improved. Accordingly, in the 1T DRAM cell device having a double-gate structure having a non-volatile function, the gate stack is configured so as not to be overlapped with the source 8 and the drain 9, so that a degree of integration and cell device characteristics can be improved.

The cell device technology according to the invention relates to a 1T DRAM cell device using no cell capacitor capable of implementing high degree of integration and high performance DRAM and an operating method for the 1T DRAM cell device. Therefore, the 1T DRAM cell device and a manufacturing method thereof can be widely adapted to a field of manufacturing a semiconductor device, particularly, a MOS-based DRAM cell device.

While the invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A one-transistor (1T) floating-body DRAM cell device comprising:
   a substrate;
   a control electrode which is disposed above the substrate;
   a gate stack disposed on the substrate, the gate stack being formed of a charge storage node disposed on the control electrode and a tunneling insulating layer disposed on the charge storage node;
   a floating body formed above the gate stack;
   a source and a drain which are formed on the floating body, wherein the floating body is extended to between the source and the gate stack and between the drain and the gate stack so that the source and the drain are not directly in contact with the gate stack;
   a gate insulating layer which is formed on the floating body; and
   a gate electrode which is formed on the gate insulating layer,
   wherein the control electrode has a length longer than that of the gate electrode, and the floating body has a length longer than that of the gate electrode.

2. The 1T floating-body DRAM cell device according to claim 1,
   wherein the gate stack further includes a blocking insulating layer disposed between the control electrode and the charge storage node.

3. The 1T floating-body DRAM cell device according to claim 1,
   wherein an additional insulating layer is formed on a side surface of the gate stack.

4. The 1T floating-body DRAM cell device according to claim 1,
   wherein the source and drain regions that are formed on the areas that are not overlapped with the control electrode have deeper junctions than the source and drain regions that are formed on the areas that are overlapped with the control electrode.

5. The 1T floating-body DRAM cell device according to claim 1, wherein the source and the drain are formed so as not to be overlapped with the gate electrode.

6. The 1T floating-body DRAM cell device according to claim 1, further comprising spacers which are formed on two side surfaces of the gate electrode.

7. The 1T floating-body DRAM cell device according to claim 1, further comprising an isolation insulating layer which is formed on some or entire side surfaces of the gate stack so as to isolate the cell device from adjacent cell devices.

8. The 1T floating-body DRAM cell device according to claim 1,
wherein the drain or the source is commonly used by an adjacent cell device.

9. The 1T floating-body DRAM cell device according to claim 1,
wherein a region between the source and the gate stack and a region between the drain and the gate stack are doped with impurities of which type is the same as that of the source and the drain, and
wherein a concentration of doped impurities of the regions is lower than those of the source and the drain.

10. The 1T floating-body DRAM cell device according to claim 9, wherein the region between the source and the gate stack and the region between the drain and the gate stack are doped by charges that are charged in the charge storage node of the gate stack or by the voltage that is applied to the control electrode with such a concentration of impurities that an inversion layer can be formed in the regions.

11. The 1T floating-body DRAM cell device according to claim 1, wherein the length of the floating body is longer than that of the control electrode.

12. The 1T floating-body DRAM cell device according to claim 1, wherein the floating body is in contact with the gate insulating layer through between the source and the drain.

13. The 1T floating-body DRAM cell device according to claim 1, wherein the source and the drain are an epitaxial layer grown on the floating body.

14. The 1T floating-body DRAM cell device according to claim 1, wherein the gate stack partially or entirely surrounds the control electrode.

15. The 1T floating-body DRAM cell device according to claim 14, wherein the gate stack is extended to between the substrate and the control electrode.

16. The 1T floating-body DRAM cell device according to claim 15,
wherein the gate stack further includes a blocking insulating layer disposed between the control electrode and the charge storage node.

* * * * *